United States Patent
Hayashi et al.

(10) Patent No.: US 12,471,368 B2
(45) Date of Patent: Nov. 11, 2025

(54) DISPLAY DEVICE

(71) Applicant: Sharp Display Technology Corporation, Kameyama (JP)

(72) Inventors: Takao Hayashi, Kameyama (JP); Junichi Yamada, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 0 days.

(21) Appl. No.: 18/864,058

(22) PCT Filed: Jul. 27, 2022

(86) PCT No.: PCT/JP2022/028909
§ 371 (c)(1),
(2) Date: Nov. 8, 2024

(87) PCT Pub. No.: WO2024/023966
PCT Pub. Date: Feb. 1, 2024

(65) Prior Publication Data
US 2025/0311424 A1    Oct. 2, 2025

(51) Int. Cl.
*G09G 5/00* (2006.01)
*G09G 3/32* (2016.01)
*H10D 86/40* (2025.01)

(52) U.S. Cl.
CPC ............ *H10D 86/441* (2025.01); *G09G 3/32* (2013.01)

(58) Field of Classification Search
CPC ...... G09G 3/32; G06F 1/1652; H10D 86/441; H10D 86/60; H10K 59/131; H10K 77/111; H05K 1/028; H05K 1/147
See application file for complete search history.

(56) References Cited

U.S. PATENT DOCUMENTS

| | | | | |
|---|---|---|---|---|
| 6,229,506 | B1 * | 5/2001 | Dawson | G09G 3/3233 345/82 |
| 6,384,804 | B1 * | 5/2002 | Dodabalapur | G09G 3/3233 345/82 |
| 9,195,108 | B2 * | 11/2015 | Park | H10K 59/40 |
| 10,319,308 | B2 * | 6/2019 | Lee | H10K 59/131 |
| 10,582,612 | B2 * | 3/2020 | Kwon | G06F 1/1626 |
| 10,903,296 | B2 * | 1/2021 | Lim | H10K 59/131 |
| 11,871,631 | B2 * | 1/2024 | Park | H10K 59/131 |

(Continued)

FOREIGN PATENT DOCUMENTS

| | | |
|---|---|---|
| JP | 2003131618 A | 5/2003 |
| JP | 2014232300 A | 12/2014 |

OTHER PUBLICATIONS

International Search Report in PCT/JP2022/028909, mailed Oct. 11, 2022, 2 pages.

*Primary Examiner* — Joe H Cheng
(74) *Attorney, Agent, or Firm* — Keating & Bennett, LLP

(57) ABSTRACT

A display device includes a display region including a data signal line and a frame region surrounding the display region, and a high-potential-side power supply voltage wiring line provided at least in the frame region, the frame region includes a bending portion provided intersecting with an extending direction of the data signal line and a video wiring line electrically connected to the data signal line and extending across the bending portion, and the data signal line is electrically connected to the high-potential-side power supply voltage wiring line via a pull-up resistor.

15 Claims, 11 Drawing Sheets

(56) References Cited

U.S. PATENT DOCUMENTS

| | | | |
|---|---|---|---|
| 11,983,346 B2* | 5/2024 | Kim | H10K 77/111 |
| 2003/0067455 A1 | 4/2003 | Kasai | |
| 2012/0218219 A1* | 8/2012 | Rappoport | H10K 59/131 |
| | | | 345/174 |
| 2014/0346474 A1* | 11/2014 | Jeong | H10K 77/10 |
| | | | 257/40 |
| 2014/0353670 A1 | 12/2014 | Youn et al. | |
| 2015/0382446 A1 | 12/2015 | Kwon et al. | |

* cited by examiner

DISPLAY DEVICE

This application filed under 35 U.S.C. § 371 is a national phase of International Patent Application PCT/JP2022/028909, filed on Jul. 27, 2022, the enclosure of which is hereby incorporated by reference in their entirety.

TECHNICAL FIELD

The disclosure relates to a display device.

BACKGROUND ART

PTL 1 discloses a display device in which a bending region is provided in a frame region surrounding a display region so that frame narrowing can be achieved without reducing the width of the frame region.

CITATION LIST

Patent Literature

PTL 1: JP 2014-232300 A

SUMMARY

Technical Problem

However, in the display device described in PTL 1, when the bending region provided in the frame region is bent, disconnection may occur in a signal line extending across the bending region. For example, in a case where the signal line extending across the bending region is a video wiring line electrically connected to a data signal line provided in the display region, when the disconnection occurs in such a video wiring line, a failure at a level that cannot be repaired, such as high-luminance display, heat generation, and smoke generation, may occur in the display device. Once a failure at a level that cannot be repaired as described above occurs in the display device, there is a problem that the display device cannot be normally driven even when a disconnected portion of the signal line extending across the bending region is repaired.

An aspect of the disclosure has been made in view of the above-described problems, and an object of the disclosure is to provide a display device that can achieve frame narrowing by including a bending portion, reduce a possibility of occurrence of a failure at a level that cannot be repaired, such as high-luminance display, heat generation, and smoke generation, even when the disconnection occurs in the video wiring line extending across the bending portion, and improve a possibility of normal driving by repairing the disconnected portion of the video wiring line extending across the bending portion.

Solution to Problem

In order to solve the above problem, a display device according to the disclosure includes
a display region including a data signal line, and a frame region surrounding the display region, and
a high-potential-side power supply voltage wiring line provided at least in the frame region.
The frame region includes a bending portion provided intersecting with an extending direction of the data signal line, and a video wiring line electrically connected to the data signal line and extending across the bending portion. The data signal line is electrically connected to the high-potential-side power supply voltage wiring line via a pull-up resistor.

Advantageous Effects of Disclosure

An aspect of the disclosure can provide a display device that can achieve frame narrowing by including a bending portion, reduce the possibility of occurrence of a failure at a level that cannot be repaired, such as high-luminance display, heat generation, and smoke generation, even when the disconnection occurs in the video wiring line extending across the bending portion, and improve the possibility of normal driving by repairing the disconnected portion of the video wiring line extending across the bending portion.

DESCRIPTION OF EMBODIMENTS

Embodiments of the disclosure will be described with reference to FIGS. 1 to 11 as follows. Hereinafter, for convenience of description, configurations having the same functions as those described in a specific embodiment are denoted by the same reference signs, and descriptions thereof will be omitted.

First Embodiment

Figure 1:
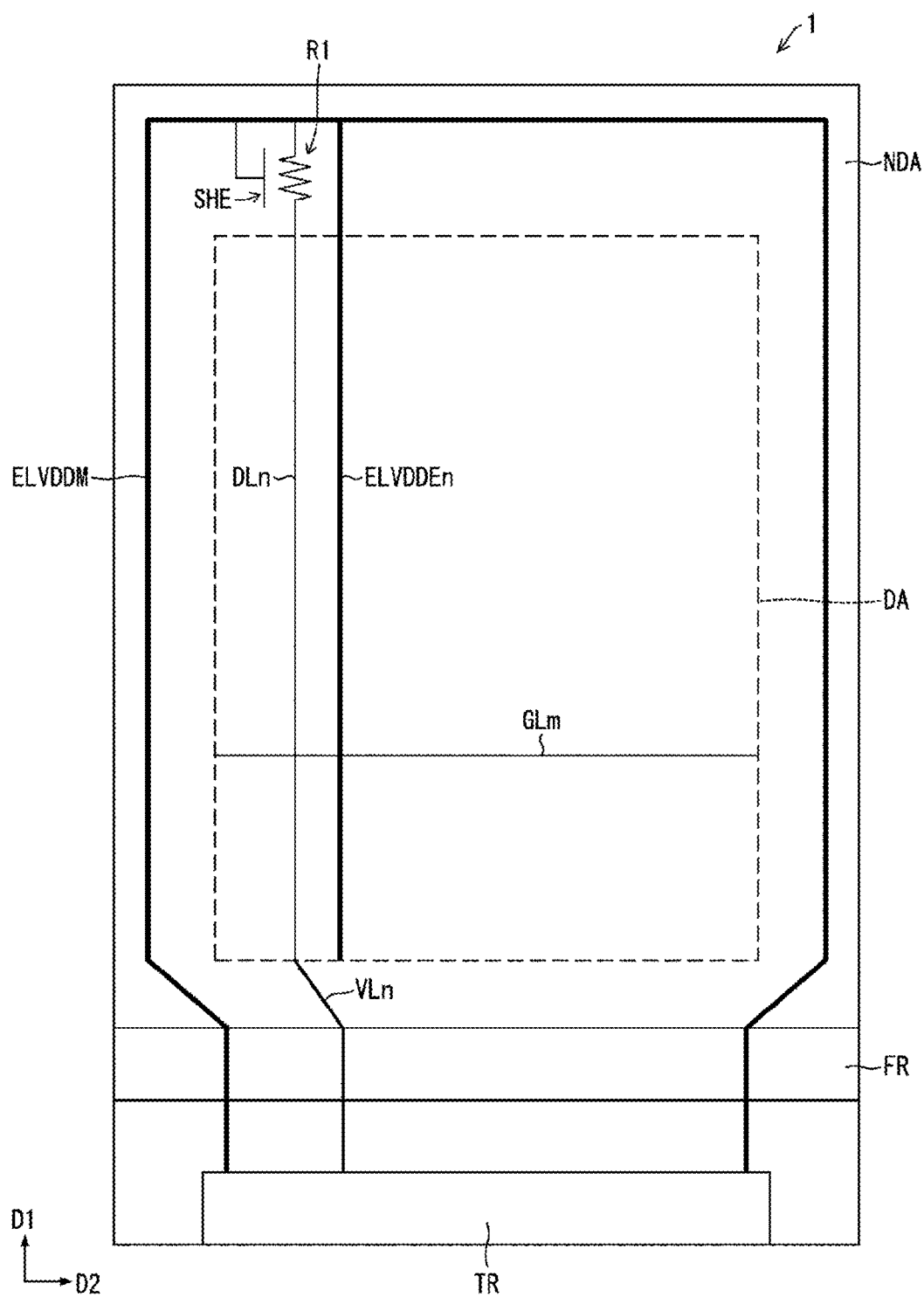
FIG. 1 is a plan view illustrating a schematic configuration of a display device according to a first embodiment.

FIG. 1 is a plan view illustrating a schematic configuration of a display device 1 according to a first embodiment.

As illustrated in FIG. 1, the display device 1 includes a display region DA including a plurality of data signal lines DLn (n is a natural number of 2 or more, and only one of the plurality of data signal lines is illustrated in FIG. 1) and a plurality of scanning signal lines GLm (m is a natural number of 2 or more, and only one of the plurality of scanning signal lines is illustrated in FIG. 1), and a frame region NDA surrounding the display region DA.

In the display device 1 according to the present embodiment, a case will be described as an example in which, as will be described later, a first high-potential-side power supply voltage wiring line (high-potential-side power supply voltage wiring line) to which the data signal line DLn is electrically connected via a pull-up resistor R1 includes a first high-potential-side power supply voltage trunk wiring line ELVDDM provided in the frame region NDA so as to surround an upper end portion, a left end portion, and a right end portion of the display region DA, and a first high-potential-side power supply voltage branch wiring line ELVDDEn electrically connected to the first high-potential-side power supply voltage trunk wiring line ELVDDM and provided in the display region DA and the frame region NDA, and is a wiring line that supplies a high-potential-side power supply voltage to a pixel circuit GC(m,n) to be described later provided in the display region DA. However, no such limitation is intended. For example, as will be described later in a second embodiment with reference to FIG. 8, the high-potential-side power supply voltage wiring line to which the data signal line DLn is electrically connected via the pull-up resistor R1 may be a second high-potential-side power supply voltage wiring line GVDD provided in the frame region NDA so as to surround the upper end portion, the left end portion, and the right end portion of the display region DA, and may be a wiring line that supplies the high-potential-side power supply voltage to a scanning-side drive circuit (not illustrated) provided in the frame region NDA.

The first high-potential-side power supply voltage trunk wiring line ELVDDM and the first high-potential-side power supply voltage branch wiring line ELVDDEn are maintained at a high-potential-side power supply voltage necessary for driving the pixel circuit GC(m,n) by supplying a predetermined voltage from a power supply circuit (not illustrated) by using a first high-potential-side power supply voltage first terminal of a terminal portion TR to which an end portion on one side of the first high-potential-side power supply voltage trunk wiring line ELVDDM is electrically connected and a second high-potential-side power supply voltage second terminal of the terminal portion TR to which an end portion on the other side of the first high-potential-side power supply voltage trunk wiring line ELVDDM is electrically connected.

In the present embodiment, a case will be described as an example in which as illustrated in FIG. 1, the pull-up resistor R1 is electrically connected to an end portion of the data signal line DLn farther from the bending portion FR, and the data signal line DLn is electrically connected to the first high-potential-side power supply voltage trunk wiring line ELVDDM, which is the first high-potential-side power supply voltage wiring line provided in the frame region NDA, via the pull-up resistor R1. However, no such limitation is intended. The data signal line DLn may be electrically connected to, for example, the first high-potential-side power supply voltage wiring line, which is an example of the high-potential-side power supply voltage wiring line and is a wiring line that supplies the high-potential-side power supply voltage to the pixel circuit GC(m,n) via a pull-up resistor R1. Although not illustrated, for example, the data signal line DLn may be electrically connected to the first high-potential-side power supply voltage branch wiring line ELVDDEn provided in the frame region NDA via the pull-up resistor R1. The data signal line DLn may be electrically connected to the first high-potential-side power supply voltage branch wiring line ELVDDEn provided in the display region DA via the pull-up resistor R1.

As illustrated in FIG. 1, the frame region NDA of the display device 1 includes a bending portion FR provided intersecting an extending direction D1 of the data signal line DLn, and a video wiring line VLn electrically connected to the data signal line DLn and extending across the bending portion FR. In the present embodiment, a case will be described as an example in which the bending portion FR is provided along an extending direction D2 of the scanning signal line GLm and is orthogonal to the extending direction D1 of the data signal line DLn. However, no such limitation is intended.

In the present embodiment, a case will be described as an example in which the bending portion FR is formed by removing a gate insulating film 4, a first inorganic insulating film 6, and a second inorganic insulating film 7, which are inorganic films, to form an opening region and filling the opening region with a first organic insulating film 9 in a part of a region where the gate insulating film 4, the first inorganic insulating film 6, and the second inorganic insulating film 7 are layered in this order on the substrate 2 (see FIG. 4). However, no such limitation is intended.

In the present embodiment, a case will be described as an example in which a resin substrate made of a resin material such as polyimide is used as the substrate 2. However, no such limitation is intended as long as the substrate 2 is a flexible substrate.

As described above, since the bending portion FR provided in the display device 1 includes the substrate 2, which is the resin substrate, and the first organic insulating film 9, the display device 1 can be easily bent at the bending portion FR.

In the present embodiment, a case will be described as an example in which the video wiring line VLn extending across the bending portion FR is formed on the first organic insulating film 9 by using the same material as that of the data signal line DLn in a step of forming the data signal line DLn, However, no such limitation is intended. An end portion on one side of the video wiring line VLn is electrically connected to the data signal line DLn, and an end portion on the other side of the video wiring line VLn is electrically connected to an n-th data signal supply terminal of the terminal portion TR. A corresponding data signal is supplied to the n-th data signal supply terminal of the terminal portion TR from the scanning-side drive circuit (not illustrated).

The wiring line extending across the bending portion FR includes, in addition to the above-described video wiring line VLn, the first high-potential-side power supply voltage trunk wiring line ELVDDM, a low-potential-side power supply voltage wiring line for supplying a low-level power supply voltage ELVSS (not illustrated), and the like.

Figure 2:
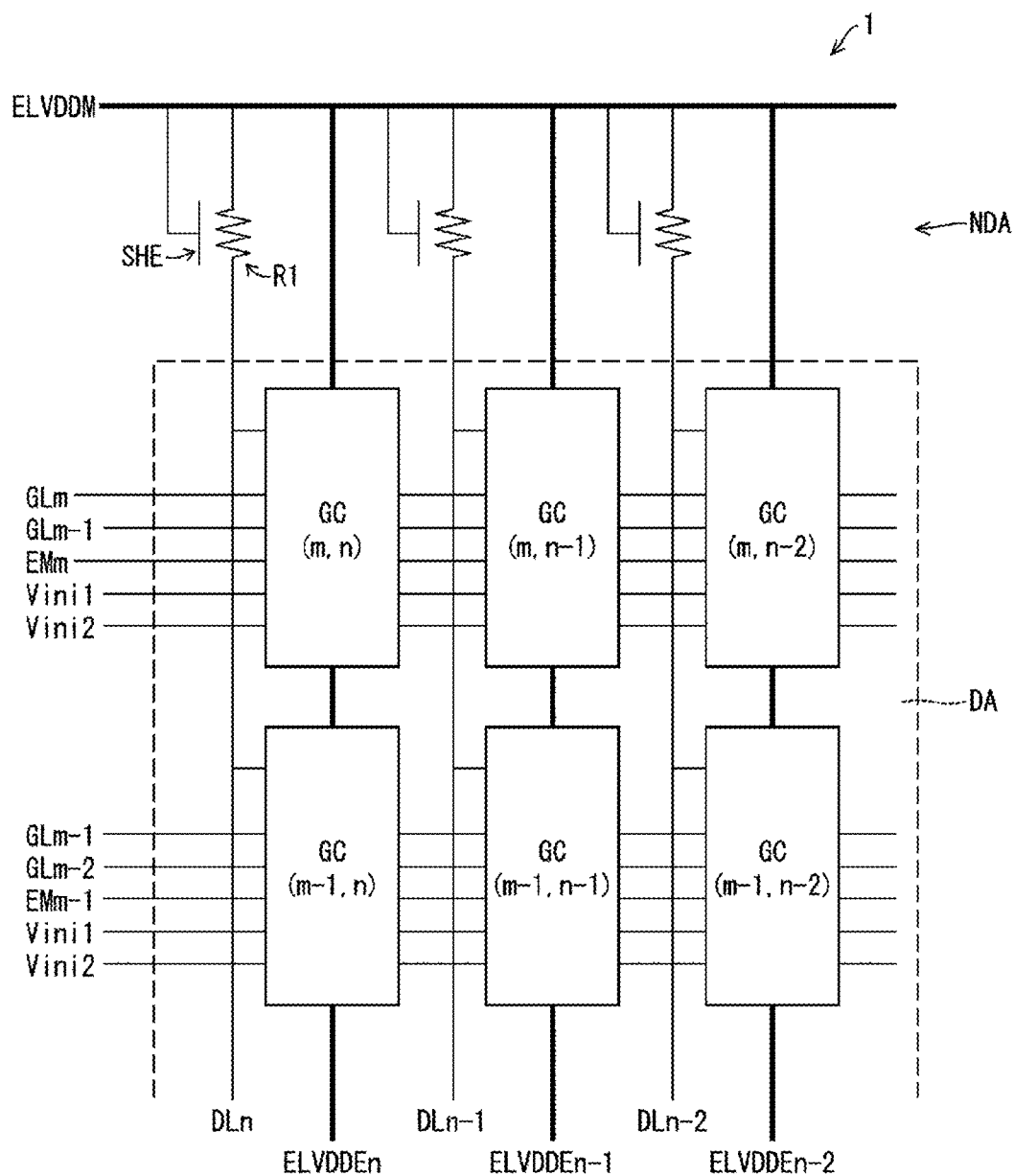
FIG. 2 is a diagram illustrating each wiring line electrically connected to a pixel circuit provided in the display device according to the first embodiment illustrated in FIG. 1.

FIG. 2 is a diagram illustrating each wiring line electrically connected to a pixel circuit GC provided in the display device 1 according to the first embodiment illustrated in FIG. 1.

As illustrated in FIG. 2, in the display device 1, pixel circuits GC(1,1) to GC(m,n) are provided corresponding to m×n pixels, respectively, provided in the display region DA. For example, the scanning signal line GLm, and the data signal line DLn electrically connected to the first high-potential-side power supply voltage trunk wiring line ELVDDM provided in the frame region NDA via the pull-up resistor R1, are electrically connected to the pixel circuit GC(m,n). In addition, a scanning signal line GLm-1, the first high-potential-side power supply voltage branch wiring line ELVDDEn for supplying the high-potential-side power supply voltage necessary for driving the pixel circuit GC(m,n), a light emission control wiring line EMm for supplying a light emission control signal, a first initialization voltage wiring line Vini1 for supplying a first initialization voltage, and a second initialization voltage wiring line Vini2 for supplying a second initialization voltage are electrically connected to the pixel circuit GC(m,n).

Figure 3:
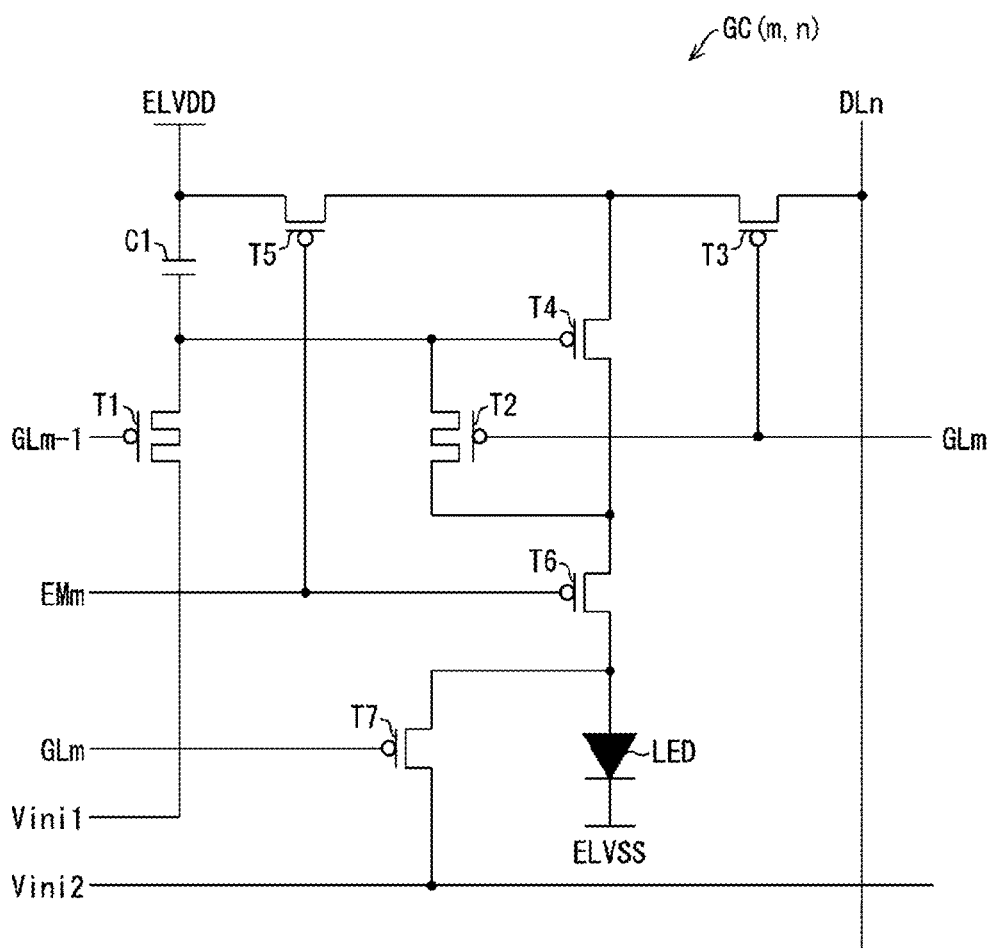
FIG. 3 is a circuit diagram illustrating the pixel circuit provided in the display device according to the first embodiment illustrated in FIG. 1.

FIG. 3 is a circuit diagram illustrating the pixel circuit GC(m,n) provided in the display device according to the first embodiment illustrated in FIG. 1.

As illustrated in FIG. 3, the pixel circuit GC(m,n) includes one organic light emitting diode (OLED) or quantum dot light emitting diode (QLED) as a light-emitting element LED, seven transistors T1 to T7, and one holding capacitor C1. In the present embodiment, a case will be described as an example in which the pixel circuit GC(m,n) includes one light-emitting element LED, seven transistors T1 to T7, and one holding capacitor C1. However, no such limitation is intended.

The transistor T1 is a first initialization transistor, the transistor T2 is a threshold compensation transistor, the transistor T3 is a write control transistor, the transistor T4 is a drive transistor, the transistor T5 is a first light emission control transistor, the transistor T6 is a second light emission control transistor, and the transistor T7 is a second initialization transistor. In the pixel circuit GC(m,n), the transistors T1 to T3 and the transistors T5 to T7 other than the transistor T4, which is the drive transistor, function as switching elements.

In the present embodiment, a case will be described as an example in which each of the transistors T1 to T7 included in the pixel circuit GC(m,n) is a P-type transistor and each of the transistors T1 to T7. which are the P-type transistors, includes a polycrystalline silicon layer as a semiconductor layer. However, no such limitation is intended. For example, each of the transistors T1 to T7 included in the pixel circuit GC(m,n) may be an N-type transistor and each of the transistors T1 to T7, which are the N-type transistors, may include an oxide semiconductor layer as the semiconductor layer. Some transistors of the transistors T1 to T7 included in the pixel circuit GC(m,n) may be the P-type transistors and the remaining transistors may be the N-type transistors. The some transistors, which are the P-type transistors, may include the polycrystalline silicon layer as the semiconductor layer, and the remaining transistors, which are the N-type transistors, may include the oxide semiconductor layer as the semiconductor layer.

As illustrated in FIG. 3, an m-th scanning signal output from the scanning-side drive circuit (not illustrated) is supplied to a gate electrode of the transistor T2 and a gate electrode of the transistor T3 via the scanning signal line GLm. In addition, an m-th light emission control signal output from a light emission control circuit (emission driver) (not illustrated) is supplied to a gate electrode of the transistor T5 and a gate electrode of the transistor T6 via the light emission control wiring line EMm. The high-level power supply voltage ELVDD is supplied from a power supply circuit (not illustrated) via the first high-potential-side power supply voltage trunk wiring line ELVDDM and the first high-potential-side power supply voltage branch wiring lines ELVDDEn, which are illustrated in FIG. 2 and high-potential-side power supply voltage wiring lines, the low-level power supply voltage ELVSS is supplied from the power supply circuit (not illustrated) via the low-potential-side power supply voltage wiring line, the first initialization voltage is supplied from the power supply circuit (not illustrated) via the first initialization voltage wiring line Vini1, and the second initialization voltage is supplied from the power supply circuit (not illustrated) via the second initialization voltage wiring line Vini2. Further, an n-th data signal output from a data-side drive circuit (not illustrated) is supplied to a source electrode of the transistor T3 via the data signal line DLn.

As illustrated in FIG. 3, an (m-1)-th scanning signal output from the scanning-side drive circuit (not illustrated) is supplied to a gate electrode of the transistor T1 via the scanning signal line GLm-1, a drain electrode of the transistor T1 is connected to an electrode on one side of the holding capacitor C1, a gate electrode of the transistor T4, and a source electrode of the transistor T2, and a source electrode of the transistor T1 is electrically connected to the first initialization voltage wiring line Vini1 to which the first initialization voltage is supplied. The gate electrode of the transistor T2 is electrically connected to the scanning signal line GLm to which the m-th scanning signal is supplied, and a drain electrode of the transistor T2 is electrically connected to a drain electrode of the transistor T4 and a source electrode of the transistor T6, and the source electrode of the transistor T2 is electrically connected to the gate electrode of the transistor T4. The gate electrode of the transistor T3 is electrically connected to the scanning signal line GLm to which the m-th scanning signal is supplied, the source electrode of the transistor T3 is electrically connected to the data signal line DLn to which the n-th data signal is supplied, and the drain electrode of the transistor T3 is electrically connected to a source electrode of the transistor T4 and a drain electrode of the transistor T5. The gate electrode of the transistor T4 is electrically connected to an electrode on one side of the holding capacitor C1 and the source electrode of the transistor T2, the source electrode of the transistor T4 is electrically connected to the drain electrode of the transistor T3 and the drain electrode of the transistor T5, and the drain electrode of the transistor T4 is electrically connected to the source electrode of the transistor T6. The gate electrode of the transistor T5 is electrically connected to the light emission control wiring line EMm to which the m-th light emission control signal is supplied, a source electrode of the transistor T5 is electrically connected to the high-potential-side power supply voltage wiring line to which the high-level power supply voltage ELVDD is supplied, and the drain electrode of the transistor T5 is electrically connected to the drain electrode of the transistor T3 and the source electrode of the transistor T4. The gate electrode of the transistor T6 is electrically connected to the light emission control wiring line EMm to which the m-th light emission control signal is supplied, the source electrode of the transistor T6 is electrically connected to the drain electrode of the transistor T4, and a drain electrode of the transistor T6 is electrically connected to an anode electrode of the light-emitting element LED. A gate electrode of the transistor T7 is electrically connected to the scanning signal line GLm to which the m-th scanning signal is supplied, a source electrode of the transistor T7 is electrically connected to the second initialization voltage wiring line Vini2 to which the second initialization voltage is supplied, and a drain electrode of the transistor T7 is electrically connected to the anode electrode of the light-emitting element LED. An electrode on the other side of the holding capacitor C1 is electrically connected to the high-potential-side power supply voltage wiring line to which the high-level power supply voltage ELVDD is supplied. A cathode electrode of the light-emitting element LED is electrically connected to the low-potential-side power supply voltage wiring line to which the low-level power supply voltage ELVSS is supplied. The gate electrode of the transistor T1 may be electrically connected to a scanning signal line GLm-2 to which an (m-2)-th scanning signal is supplied. In the present embodiment, the case has been described as an example in which the gate electrode of the transistor T7 is electrically connected to the scanning signal line GLm to which the m-th scanning signal is supplied. However, no such limitation is intended, and the gate electrode of the transistor T7 may be electrically connected to a discharge signal line to which an m-th discharge signal is supplied.

In the case of the display device 1 illustrated in FIG. 1, by bending the display device 1 at the bending portion FR described above, frame narrowing in which the frame region NDA can be reduced can be achieved without reducing the width of the frame region NDA. However, in a step of bending the display device 1 at the bending portion FR, in the video wiring line VLn extending across the bending portion FR, the disconnection may occur due to a crack or the like generated in the step of bending.

In the display device 1 according to the present embodiment, as illustrated in FIGS. 1 and 2, the data signal lines DLn electrically connected to the video wiring lines VLn, respectively, extending across the bending portion FR are each electrically connected to the first high-potential-side power supply voltage trunk wiring line ELVDDM provided in the frame region NDA via the pull-up resistor R1. Thus, even when the disconnection occurs in the video wiring line VLn extending across the bending portion FR, the data signal line DLn electrically connected to the video wiring line VLn is not brought into a floating state. Since the data signal line DLn electrically connected to the video wiring line VLn is not brought into the floating state, a current greatly exceeding a normally assumed current can be suppressed from flowing through the wiring line. Thus, in the display device 1, the possibility of occurrence of a failure at a level that cannot be repaired, such as high-luminance display, heat generation, and smoke generation, can be reduced, and the display device 1 can be achieved in which the possibility of normal driving is improved by repairing the disconnected portion of the video wiring line VLn extending across the bending portion FR.

In the present embodiment, a case will be described as an example in which all of the data signal lines DLn electrically connected to the video wiring lines VLn, respectively, extending across the bending portion FR are each electrically connected to the first high-potential-side power supply voltage trunk wiring line ELVDDM provided in the frame region NDA via the pull-up resistor R1. However, no such limitation is intended, and when one or more of the data signal lines DLn electrically connected to the video wiring lines VLn, respectively, extending across the bending portion FR are each electrically connected to the first high-potential-side power supply voltage trunk wiring line ELVDDM provided in the frame region NDA via the pull-up resistor R1, the possibility of occurrence of a failure at a level that cannot be repaired, such as high-luminance display, heat generation, and smoke generation, can be reduced.

On the other hand, in the related art, the data signal lines DLn electrically connected to the video wiring lines VLn, respectively, extending across the bending portion FR are each not electrically connected to the high-potential-side power supply voltage wiring line via the pull-up resistor. Thus, when the disconnection occurs in the video wiring line VLn extending across the bending portion FR, some of the video wiring lines VLn electrically connected to the data signal lines DLn and the data signal lines DLn are brought into the floating state. That is, when the disconnection occurs in the video wiring line VLn extending across the bending portion FR, the data signal lines DLn electrically connected to pixel circuits GC(1,n) to GC(m,n), respectively, are brought into the floating state. After the first initialization voltage is written to the gate electrodes of the transistors T4 of the pixel circuits GC(1,n) to GC(m,n), respectively, in order to initialize the pixel circuits GC(1,n) to GC(m,n), a video voltage (for example, +2 V to +7 V) to be originally written is not written to the gate electrodes of the transistors T4 of the pixel circuits GC(1,n) to GC(m,n), respectively, and the gate electrodes of the transistors T4 of the pixel circuits GC(1,n) to GC(m,n), respectively, are maintained at a voltage near the first initialization voltage. Since the first initialization voltage is approximately −4 V to −5 V, a large current flows between the source electrode and the drain electrode in the transistors T4 of the pixel circuits GC(1,n) to GC(m,n), respectively, and high-luminance display (high-luminance light emission) occurs in the light-emitting elements LED provided in the pixel circuits GC(1,n) to GC(m, n), respectively. Thus, a large current flows from the high-level power supply voltage ELVDD to the low-level power supply voltage ELVSS in each of the pixel circuits GC(1,n) to GC(m,n), and a very large current flows through the low-potential-side power supply voltage wiring line of the bending portion FR where the low-potential-side power supply voltage wiring line that supplies the low-level power supply voltage ELVSS joins. Since various wiring lines provided in the bending portion FR adopt a shape for bending, the resistance thereof is relatively higher than that of a region other than the bending portion FR, and the same applies to the low-potential-side power supply voltage wiring line for supplying the low-level power supply voltage ELVSS. For the reasons described above, the low-potential-side power supply voltage wiring line provided in the bending portion FR is most affected by the large current and the heat generation or smoke generation is likely to occur. When the disconnection occurs in the low-potential-side power supply voltage wiring line of the bending portion FR in the bending step or when the disconnection occurs in the low-potential-side power supply voltage wiring line of the bending portion FR due to the influence of the smoke generation or heat generation described above, the current is further concentrated on the normal low-potential-side power supply voltage wiring line of the bending portion FR which is not disconnected, and the degree of the heat generation or smoke generation becomes worse. Thus, in the display device of the related art in which the data signal lines DLn electrically connected to the video wiring lines VLn, respectively, extending across the bending portion FR are each not electrically connected to the high-potential-side power supply voltage wiring line via the pull-up resistor R1, when the disconnection occurs in the video wiring line VLn extending across the bending portion FR, the possibility of occurrence of a failure at a level that cannot be repaired, such as high-luminance display (high-luminance light emission), heat generation, and smoke generation, cannot be reduced, and even when the disconnected portion of the video wiring line VLn extending across the bending portion FR is repaired, there is a high possibility that the display device cannot be normally driven.

Figure 4:
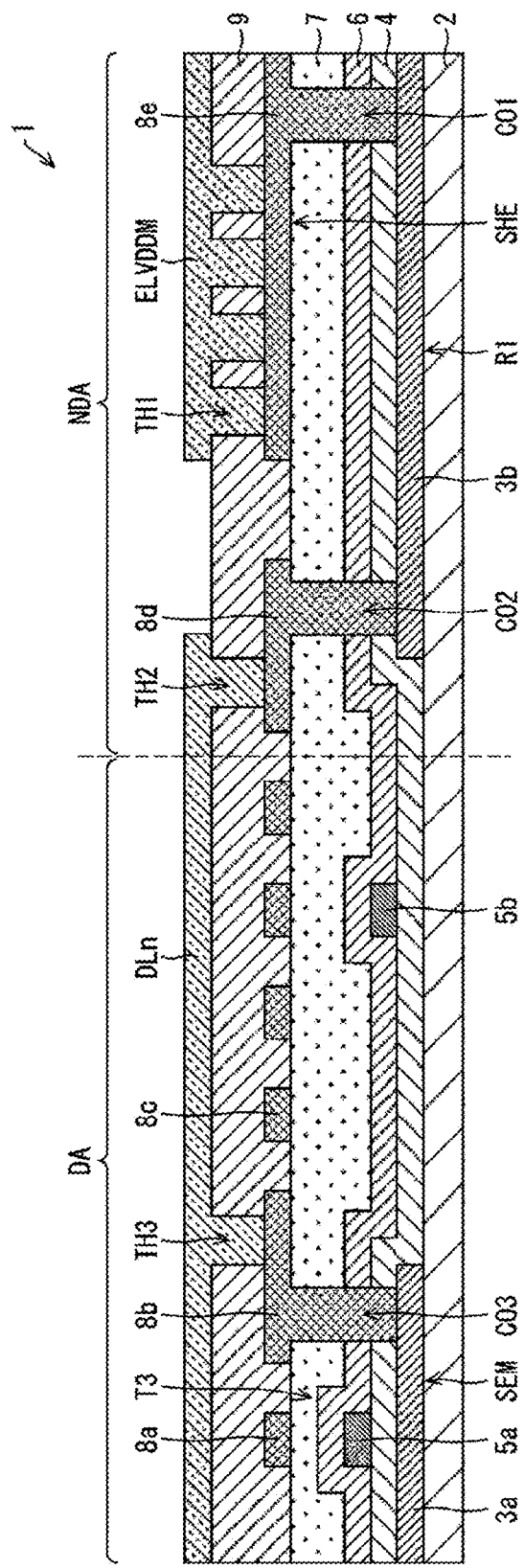
FIG. 4 is a cross-sectional view illustrating a schematic configuration of a portion where a data signal line is electrically connected to a high-potential-side power supply voltage wiring line via a pull-up resistor in the display device according to the first embodiment illustrated in FIG. 1.

FIG. 4 is a cross-sectional view illustrating a schematic configuration of a portion where the data signal line DLn is electrically connected to the first high-potential-side power supply voltage trunk wiring line ELVDDM, which is the high-potential-side power supply voltage wiring line, via the pull-up resistor R1 in the display device 1 according to the first embodiment illustrated in FIG. 1.

As illustrated in FIGS. 1, 2, and 4, the display device 1 includes a shielding portion SHE electrically connected to the first high-potential-side power supply voltage trunk wiring line ELVDDM, which is the high-potential-side power supply voltage wiring line. As illustrated in FIG. 4, the shielding portion SHE is provided between the first high-potential-side power supply voltage trunk wiring line ELVDDM, which is the high-potential-side power supply voltage wiring line, and the pull-up resistor R1 and overlaps at least a part of the pull-up resistor R1.

As described above, the shielding portion SHE electrically connected to the first high-potential-side power supply voltage trunk wiring line ELVDDM, which is the high-potential-side power supply voltage wiring line, and maintained at the first high-potential-side power supply voltage is included. Thus an influence of an electrical field of other wiring lines and an influence of electrostatic capacitance of various insulating films can be reduced by the shielding portion SHE, and a configuration can be obtained in which only an influence of a stable high potential from the shielding portion SHE is received.

In the display device 1 according to the present embodiment, a case will be described as an example in which as illustrated in FIG. 4, the first high-potential-side power supply voltage trunk wiring line ELVDDM, which is the high-potential-side power supply voltage wiring line, and the pull-up resistor R1 are electrically connected to each other via the shielding portion SHE. However, no such limitation is intended, and the first high-potential-side power supply voltage trunk wiring line ELVDDM, which is the high-potential-side power supply voltage wiring line, and the pull-up resistor R1 may be electrically connected to each other via a conductive member other than the shielding portion SHE, or the first high-potential-side power supply voltage trunk wiring line ELVDDM, which is the high-potential-side power supply voltage wiring line, and the pull-up resistor R1 may be in direct contact with each other.

In the display device 1 according to the present embodiment, as illustrated in FIG. 4, semiconductor layers 3a and 3b, the gate insulating film 4, first conductive layers 5a and 5b, the first inorganic insulating film 6, the second inorganic insulating film 7, second conductive layers 8a, 8b, 8c, 8d, and 8e, the first organic insulating film 9, and a third conductive layer forming the data signal line DLn and the first high-potential-side power supply voltage trunk wiring line ELVDDM are provided in this order from the substrate 2 side on the substrate 2, which is a flexible substrate.

Although not illustrated, a second organic insulating film is provided on the third conductive layer and the first organic insulating film 9, the third conductive layer forming the data signal line DLn and the first high-potential-side power supply voltage trunk wiring line ELVDDM, a fourth conductive layer forming the anode electrode of the light-emitting element LED illustrated in FIG. 3 is provided on the second organic insulating film in the display region DA, and a third organic insulating film is provided on the fourth conductive layer forming the anode electrode and the second organic insulating film.

Of the semiconductor layers 3a and 3b, the semiconductor layer (first semiconductor layer) 3a is a semiconductor layer provided in the transistor T3 including the source electrode electrically connected to the data signal line DLn illustrated in FIG. 3, and the semiconductor layer 3b is the pull-up resistor R1 illustrated in FIGS. 1 and 2.

In the present embodiment, a case will be described as an example in which the polycrystalline silicon layer is used as the semiconductor layers 3a and 3b. However, no such limitation is intended. As described above, by forming the pull-up resistor R1 by using the polycrystalline silicon layer, the pull-up resistor R1 having a relatively high resistance value can be provided.

The semiconductor layer 3a provided in the transistor T3 is a semiconductor layer in which a source region and a drain region are formed by doping a part of the polycrystalline silicon layer with an impurity, and the semiconductor layer 3b functioning as the pull-up resistor R1 is preferably a semiconductor layer in which the polycrystalline silicon layer is not doped with the impurity. As described above, by forming the pull-up resistor R1 by using the semiconductor layer not doped with the impurity, the pull-up resistor R1 having a further high resistance value can be provided.

As described above, in the present embodiment, the case has been described as an example in which the semiconductor layer 3b forming the pull-up resistor R1 is made of the same material as the semiconductor layer (first semiconductor layer) 3a provided in the transistor (first transistor) T3 including the source electrode (first input electrode) electrically connected to the data signal line DLn and the semiconductor layer (first semiconductor layer) 3a. However, no such limitation is intended. For example, as illustrated in FIG. 3, the pixel circuit GC(m,n) may include the transistor (first transistor) T3 including the source electrode (first input electrode) electrically connected to the data signal line DLn and the semiconductor layer (first semiconductor layer) 3a, and the transistor (second transistor, one of T1, T2, and T4 to T7) including the source electrode (second input electrode) and the semiconductor layer (second semiconductor layer), and the semiconductor layer 3b forming the pull-up resistor R1 may be made of the same material as the semiconductor layer (second semiconductor layer) provided in the transistor (second transistor, one of T1, T2, and T4 to T7).

Of the first conductive layers 5a and 5b illustrated in FIG. 4, the first conductive layer 5a is the gate electrode provided in the transistor (first transistor) T3, and the first conductive layer 5b is a wiring line.

Of the second conductive layers 8a, 8b, 8c, 8d, and 8e illustrated in FIG. 4, the second conductive layer 8b is the source electrode provided in the transistor (first transistor) T3, the second conductive layer 8d is a first conductive member that electrically connects the data signal line DLn and the pull-up resistor R1 to each other, and the second conductive layer 8e is a second conductive member that electrically connects the pull-up resistor R1 and the first high-potential-side power supply voltage trunk wiring line ELVDDM to each other and is the shielding portion SHE, and the second conductive layer 8a and the second conductive layer 8c are wiring lines.

In the present embodiment, a case will be described as an example in which as illustrated in FIG. 4, the second conductive layer 8e, which is the second conductive member and the shielding portion SHE, is also formed in a first contact hole CO1 formed in the gate insulating film 4, the first inorganic insulating film 6, and the second inorganic insulating film 7, the second conductive layer 8d, which is the first conductive member, is also formed in a second contact hole CO2 formed in the gate insulating film 4, the first inorganic insulating film 6 and the second inorganic insulating film 7, and the second conductive layer 8b, which is the source electrode, is also formed in a third contact hole CO3 formed in the gate insulating film 4, the first inorganic insulating film 6 and the second inorganic insulating film 7. However, no such limitation is intended. For example, another conductive member may be further formed in the first contact hole CO1, the second contact hole CO2, and the third contact hole CO3.

The first high-potential-side power supply voltage trunk wiring line ELVDDM illustrated in FIG. 4 is in contact with the second conductive layer 8e, which is the second conductive member and the shielding portion SHE, via a plurality of first through holes TH1 provided in the first organic insulating film 9, and thus the first high-potential-side power supply voltage trunk wiring line ELVDDM and the second conductive layer 8e are electrically connected to each other.

The data signal line DLn illustrated in FIG. 4 is in contact with the second conductive layer 8d, which is the first conductive member, via a second through hole TH2 provided in the first organic insulating film 9, and thus the data signal line DLn and the second conductive layer 8d are electrically connected to each other. The data signal line DLn illustrated in FIG. 4 is in contact with the second conductive layer 8b, which is the source electrode, via a third through hole TH3 provided in the first organic insulating film 9, and thus the data signal line DLn and the second conductive layer 8b are electrically connected to each other.

Figure 5:
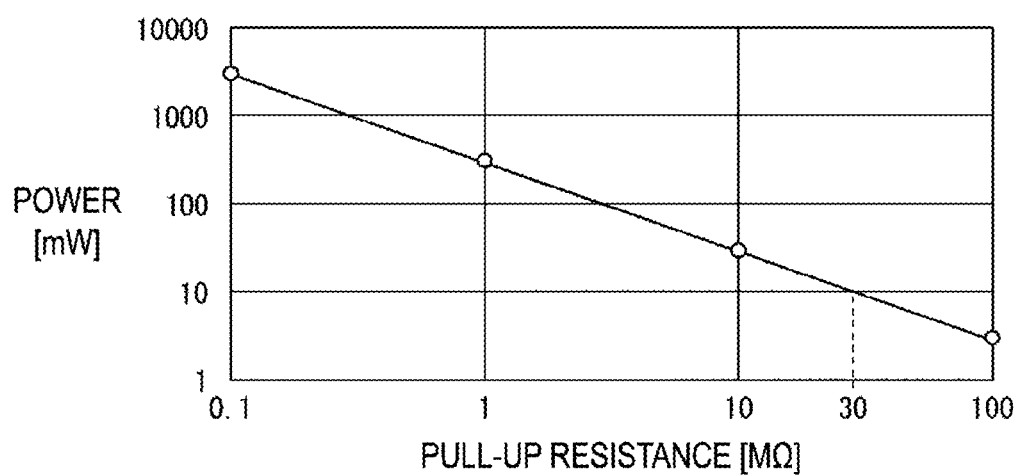
FIG. 5 is a diagram for describing a preferable resistance value of the pull-up resistor when considering power consumption of the display device according to the first embodiment illustrated in FIG. 1.

FIG. 5 is a diagram for describing a preferable resistance value of the pull-up resistor R1 when considering power consumption of the display device 1 according to the first embodiment illustrated in FIG. 1.

As illustrated in FIG. 5, when considering suppression of an increase in the power consumption of the display device 1 as much as possible, for example, suppression of the increase to be 10 mW or less, the resistance value of the pull-up resistor R1 is preferably 30 MΩ or more.

Figure 6:
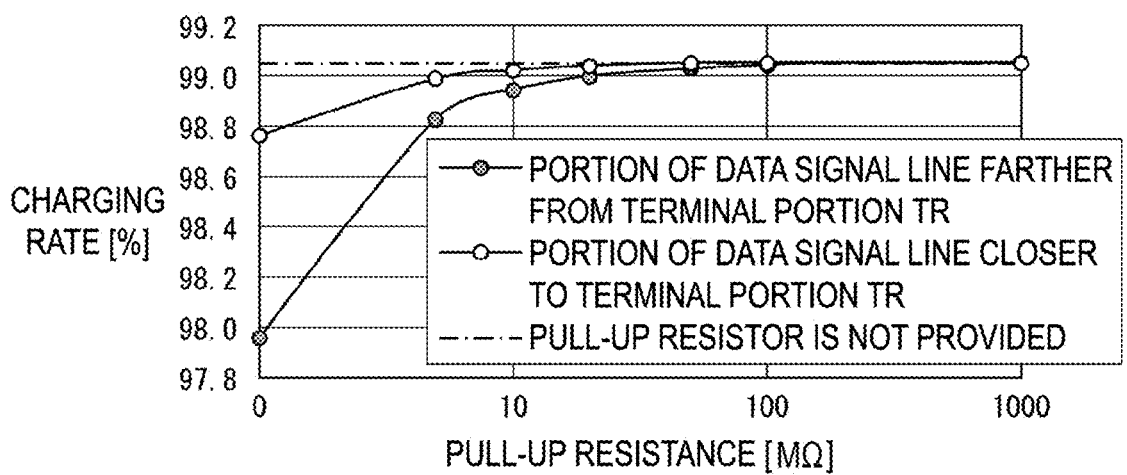
FIG. 6 is a diagram for describing a preferable resistance value of the pull-up resistor when considering a charging rate of the data signal line of the display device according to the first embodiment illustrated in FIG. 1.

FIG. 6 is a diagram for describing a preferable resistance value of the pull-up resistor R1 when considering a charging rate of the data signal line DLn of the display device 1 according to the first embodiment illustrated in FIG. 1.

When considering that charging rates of both a portion of the data signal line DLn farther from the terminal portion TR of the data signal line DLn and a portion of the data signal line DLn closer to the terminal portion TR when the pull-up resistor R1 is provided are substantially equal to the charging rates when the pull-up resistor R1 is not provided, that is, that the pull-up resistor R1 can be set so as not to hinder the charging rate, the resistance value of the pull-up resistor R1 is preferably 50 MΩ or more as illustrated in FIG. 6.

Figure 7:
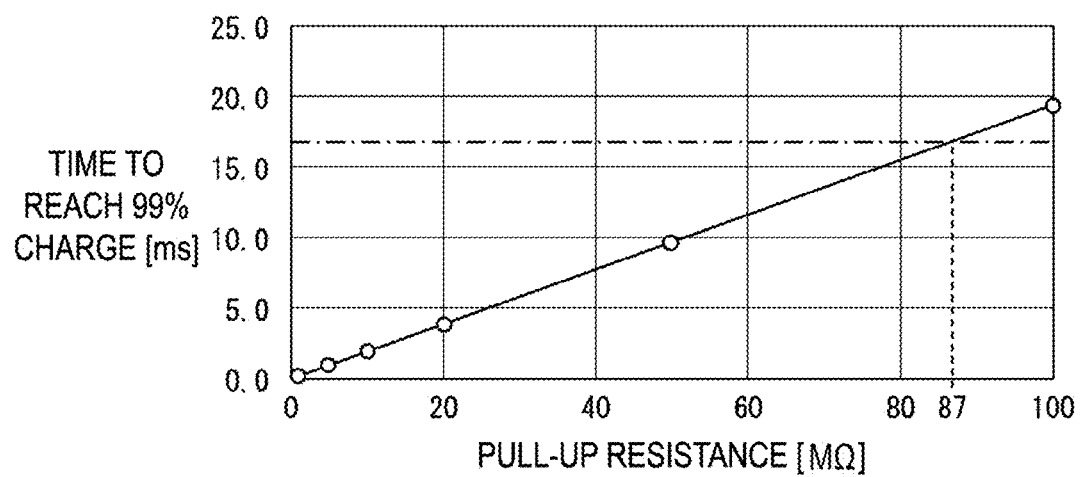
FIG. 7 is a diagram for describing a preferable resistance value of the pull-up resistor when considering 99% charging of the data signal line within one frame period of the display device according to the first embodiment illustrated in FIG. 1.

FIG. 7 is a diagram for describing a preferable resistance value of the pull-up resistor R1 when considering 99% charging of the data signal line DLn within one frame period of the display device 1 according to the first embodiment illustrated in FIG. 1.

As illustrated in FIG. 7, when considering 99% charging of the data signal line DLn within one frame period of the display device 1, that is, within 16.67 ms, the resistance value of the pull-up resistor R1 is preferably 87 MΩ or less.

From the above, the resistance value of the pull-up resistor R1 is preferably 30 MΩ or more and 87 MΩ or less, and more preferably 50 MΩ or more and 80 MΩ or less.

Second Embodiment

Next, a second embodiment of the disclosure will be described with reference to FIG. 8. A display device 1a according to the present embodiment is different from the display device 1 according to the first embodiment described above in that the high-potential-side power supply voltage wiring line to which the data signal line DLn is electrically connected via the pull-up resistor R1 is the second high-potential-side power supply voltage wiring line GVDD, and the second high-potential-side power supply voltage wiring line GVDD is a wiring line that supplies the high-potential-side power supply voltage to the scanning-side drive circuit (not illustrated) provided in the frame region NDA. The other details are as described in the first embodiment. For convenience of description, members having the same functions as those shown in the drawings according to the first embodiment are denoted by the same reference numerals and signs, and descriptions thereof will be omitted.

Figure 8:
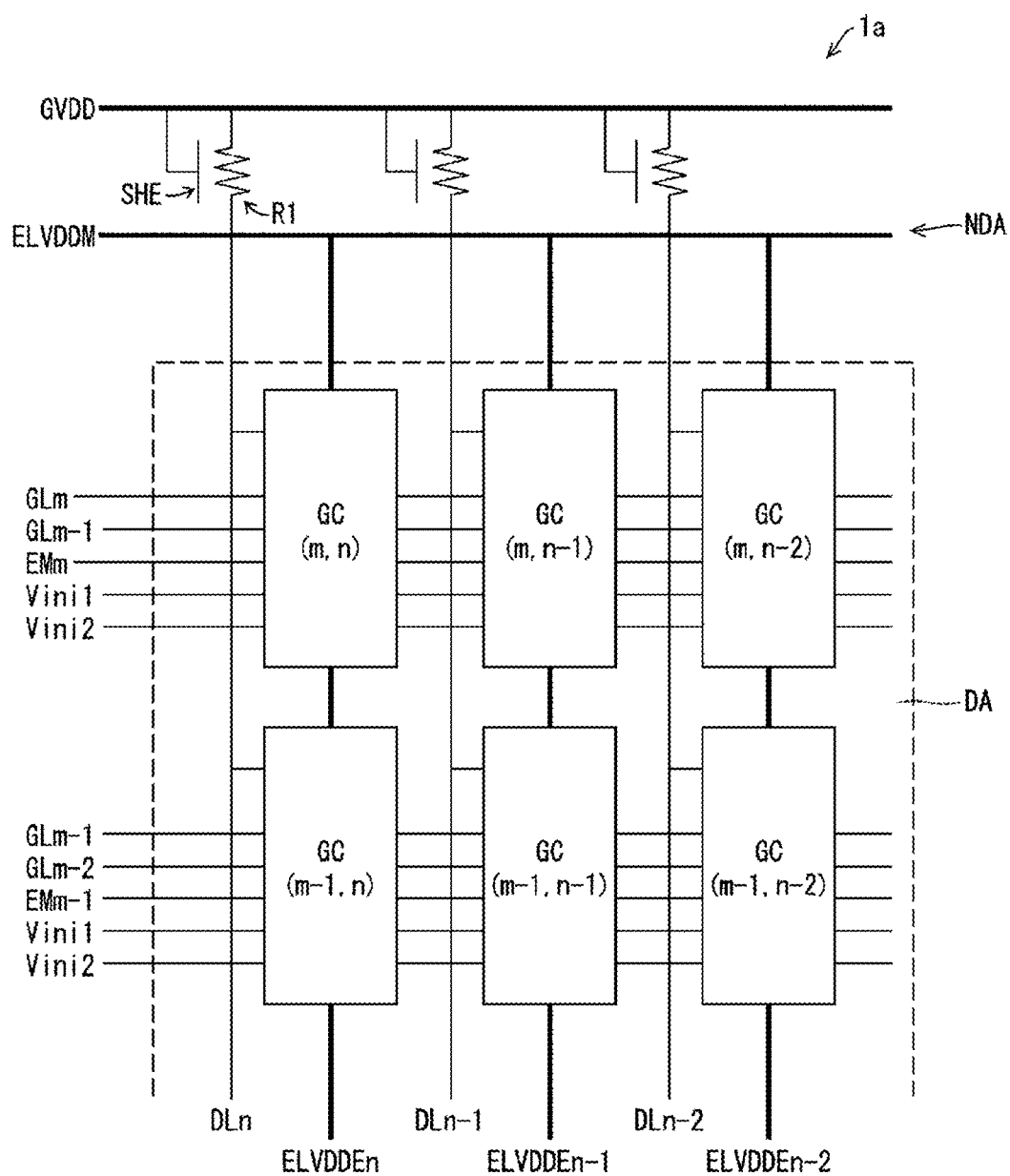
FIG. 8 is a view illustrating a schematic configuration of a display device according to a second embodiment.

FIG. 8 is a view illustrating a schematic configuration of the display device 1a according to the second embodiment.

As illustrated in FIG. 8, in the display device 1a, the high-potential-side power supply voltage wiring line to which the data signal line DLn is electrically connected via the pull-up resistor R1 is the second high-potential-side power supply voltage wiring line GVDD, and the second high-potential-side power supply voltage wiring line GVDD is the wiring line that supplies the high-potential-side power supply voltage to the scanning-side drive circuit (not illustrated) provided in the frame region NDA.

According to the display device 1a, even when the disconnection occurs in the video wiring line VLn extending across the bending portion FR, the data signal line DLn electrically connected to the video wiring line VLn is not brought into a floating state. Since the data signal line DLn electrically connected to the video wiring line VLn is not brought into the floating state, a current greatly exceeding a normally assumed current can be suppressed from flowing through the wiring line. Thus, in the display device 1a, the possibility of occurrence of a failure at a level that cannot be repaired, such as high-luminance display, heat generation, and smoke generation, can be reduced, and the display device 1a can be achieved in which the possibility of normal driving is improved by repairing the disconnected portion of the video wiring line VLn extending across the bending portion FR.

As illustrated in FIG. 8, the display device 1a includes the shielding portion SHE electrically connected to the second high-potential-side power supply voltage wiring line GVDD, which is the high-potential-side power supply voltage wiring line, and maintained at a second high-potential-side power supply voltage. Thus an influence of an electrical field of other wiring lines and an influence of electrostatic capacitance of various insulating films can be reduced by the shielding portion SHE, and a configuration can be obtained in which only an influence of a stable high potential from the shielding portion SHE is received.

Third Embodiment

Next, a third embodiment of the disclosure will be described with reference to FIG. 9. A display device 1b according to the present embodiment is different from the display devices 1 and 1a according to the first and second embodiments described above in that the display device 1b includes, as the high-potential-side power supply voltage wiring line, the first high-potential-side power supply voltage wiring line including the first high-potential-side power supply voltage trunk wiring line ELVDDM provided in the frame region NDA and the first high-potential-side power supply voltage branch wiring line ELVDDEn provided in the display region DA and the frame region NDA, and the second high-potential-side power supply voltage wiring line GVDD provided in the frame region NDA, the display device 1b includes, as the pull-up resistor, a first pull-up resistor R1 electrically connected to an end portion of the data signal line DLn farther from the bending portion FR and a second pull-up resistor R2 connected in series to the first pull-up resistor R1, and the data signal line DLn is electrically connected to the second high-potential-side power supply voltage wiring line GVDD via the above described pull-up resistors. The other details are as described in the first and second embodiments. For convenience of description, members having the same functions as those shown in the drawings according to the first and second embodiments are denoted by the same reference numerals and signs, and descriptions thereof will be omitted.

Figure 9:
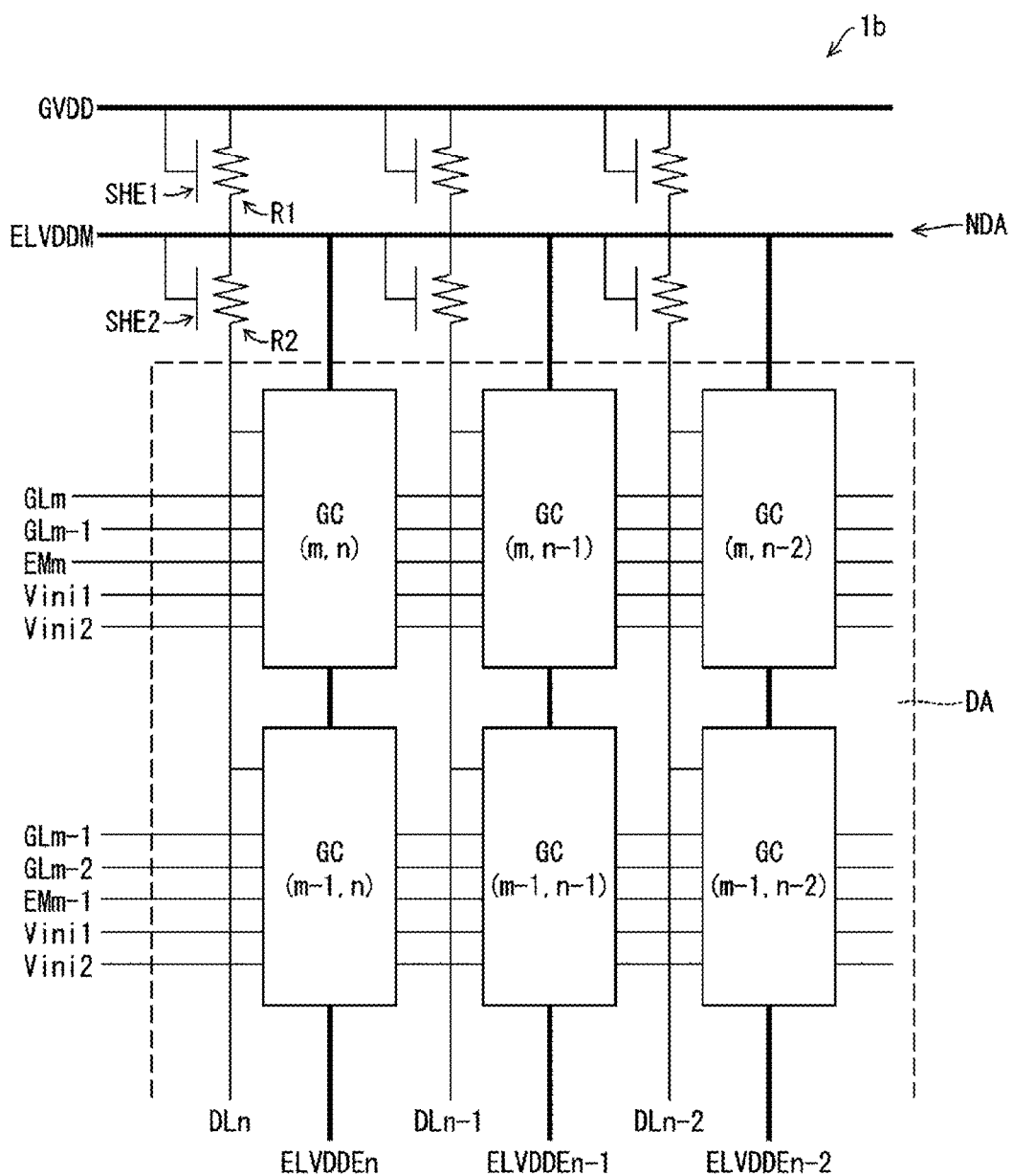
FIG. 9 is a view illustrating a schematic configuration of a display device according to a third embodiment.

FIG. 9 is a view illustrating a schematic configuration of the display device 1b according to a third embodiment.

As illustrated in FIG. 9, the display device 1b includes, as the high-potential-side power supply voltage wiring line, the first high-potential-side power supply voltage wiring line including the first high-potential-side power supply voltage trunk wiring line ELVDDM provided in the frame region NDA and the first high-potential-side power supply voltage branch wiring line ELVDDEn provided in the display region DA and the frame region NDA, and the second high-potential-side power supply voltage wiring line GVDD provided in the frame region NDA. The display device 1b includes, as the pull-up resistor, the first pull-up resistor R1 electrically connected to the end portion of the data signal line DLn farther from the bending portion FR and the second pull-up resistor R2 connected in series to the first pull-up resistor R1. The data signal line DLn is electrically connected to the second high-potential-side power supply voltage wiring line GVDD via the above-described pull-up resistors, that is, the first pull-up resistor R1 and the second pull-up resistor R2. A resistance value of the pull-up resistor obtained by connecting in series the first pull-up resistor R1 and the second pull-up resistor R2 to each other is the sum of the resistance value of the first pull-up resistor R1 and the resistance value of the second pull-up resistor R2.

According to the display device 1b, even when the disconnection occurs in the video wiring line VLn extending across the bending portion FR, the data signal line DLn electrically connected to the video wiring line VLn is not brought into a floating state. Since the data signal line DLn electrically connected to the video wiring line VLn is not brought into the floating state, a current greatly exceeding a normally assumed current can be suppressed from flowing through the wiring line. Thus, in the display device 1b, the possibility of occurrence of a failure at a level that cannot be repaired, such as high-luminance display, heat generation, and smoke generation, can be reduced, and the display device 1b can be achieved in which the possibility of normal driving is improved by repairing the disconnected portion of the video wiring line VLn extending across the bending portion FR.

As illustrated in FIG. 9, the display device 1b includes a first shielding portion SHE1 electrically connected to the second high-potential-side power supply voltage wiring line GVDD and a second shielding portion SHE2 electrically connected to the first high-potential-side power supply voltage trunk wiring line ELVDDM, which is the first high-potential-side power supply voltage wiring line. Similarly to the case illustrated in FIG. 4, the first shielding portion SHE1 is provided between the second high-potential-side power supply voltage wiring line GVDD and the first pull-up resistor R1 and overlaps at least a part of the first pull-up resistor R1, and similarly to the case illustrated in FIG. 4, the second shielding portion CHE2 is also provided between the first high-potential-side power supply voltage trunk wiring line ELVDDM, which is the first high-potential-side power supply voltage wiring line, and the second pull-up resistor R2 and overlaps at least a part of the second pull-up resistor R2.

The second high-potential-side power supply voltage wiring line GVDD and the first pull-up resistor R1 illustrated in FIG. 9 may be electrically connected to each other via the first shielding portion SHE1 as in the case illustrated in FIG. 4, and the first high-potential-side power supply voltage trunk wiring line ELVDDM, which is the first high-potential-side power supply voltage wiring line, and the second pull-up resistor R2 illustrated in FIG. 9 may be electrically connected to each other via the second shielding portion SHE2 as in the case illustrated in FIG. 4.

The display device 1b includes the first shielding portion SHE1 electrically connected to the second high-potential-side power supply voltage wiring line GVDD and maintained at the second high-potential-side power supply voltage, and the second shielding portion SHE2 electrically connected to the first high-potential-side power supply voltage trunk wiring line ELVDDM, which is the first high-potential-side power supply voltage wiring line, and maintained at the first high-potential-side power supply voltage. Thus, an influence of the electrical field of other wiring lines and an influence of the electrostatic capacitance of various insulating films can be reduced by the first shielding portion SHE1 and the second shielding portion SHE2, and a configuration can be obtained in which only the influence of the stable high potential from the first shielding portion SHE1 and the second shielding portion SHE2 is received.

Fourth Embodiment

Next, a fourth embodiment of the disclosure will be described with reference to FIG. 10. A display device 1c according to the present embodiment is different from the display device 1b of the third embodiment described above in that the data signal line DLn is electrically connected to the first high-potential-side power supply voltage trunk wiring line ELVDDM, which is the first high-potential-side power supply voltage wiring line, via the first pull-up resistor R1 and the second pull-up resistor R2 connected in series to each other. The other details are as described in the third embodiment. For convenience of description, members having the same functions as those shown in the drawings according to the third embodiment are denoted by the same reference numerals and signs, and descriptions thereof will be omitted.

Figure 10:
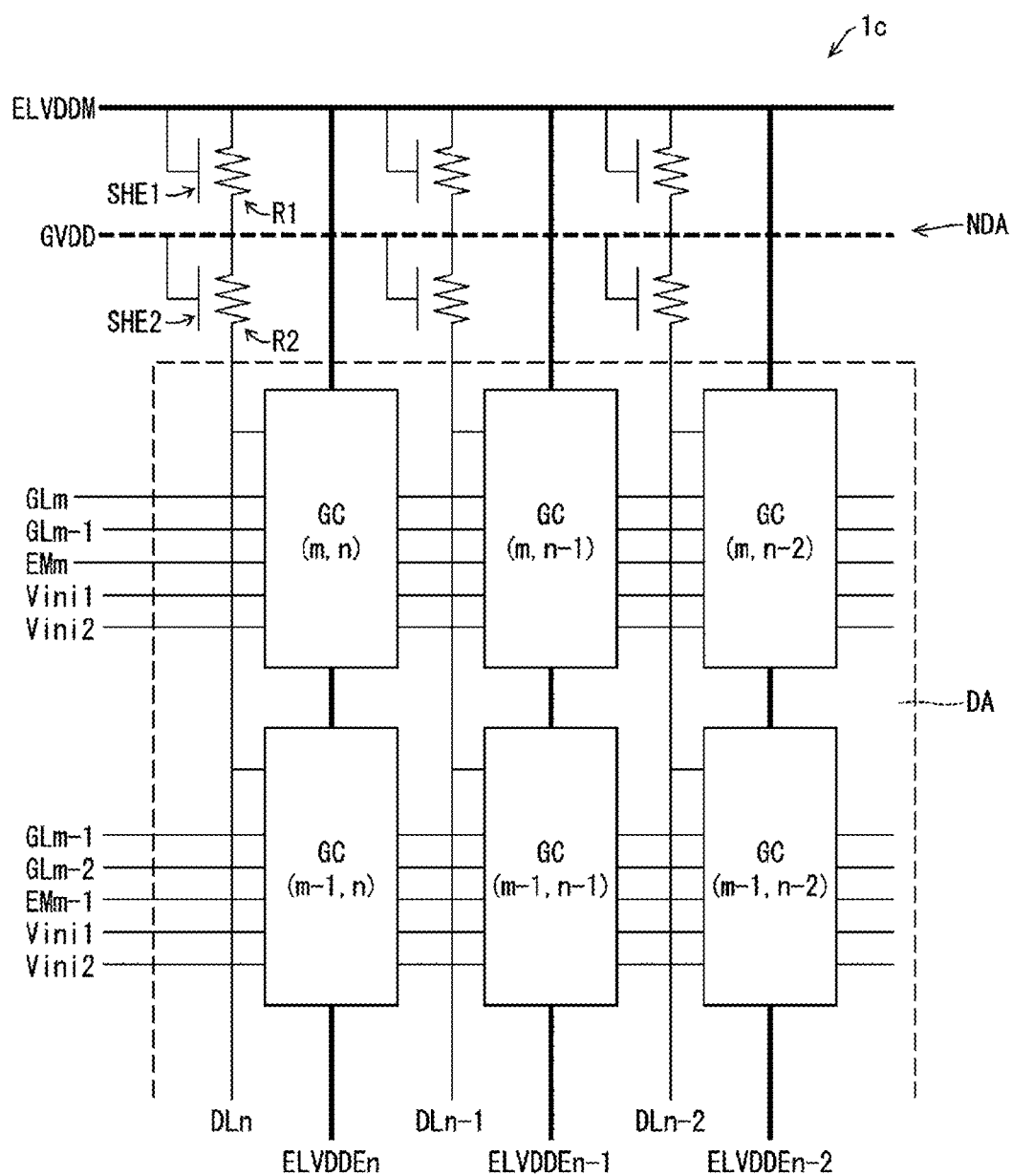
FIG. 10 is a view illustrating a schematic configuration of a display device according to a fourth embodiment.

FIG. 10 is a view illustrating a schematic configuration of the display device 1c according to the fourth embodiment.

As illustrated in FIG. 10, the display device 1c includes, as the high-potential-side power supply voltage wiring line, the first high-potential-side power supply voltage wiring line including the first high-potential-side power supply voltage trunk wiring line ELVDDM provided in the frame region NDA and the first high-potential-side power supply voltage branch wiring line ELVDDEn provided in the display region DA and the frame region NDA, and the second high-potential-side power supply voltage wiring line GVDD provided in the frame region NDA. The display device 1c includes, as the pull-up resistor, the first pull-up resistor R1 electrically connected to the end portion of the data signal line DLn farther from the bending portion FR and the second pull-up resistor R2 connected in series to the first pull-up resistor R1. The data signal line DLn is electrically connected to the first high-potential-side power supply voltage trunk wiring line ELVDDM, which is the first high-potential-side power supply voltage wiring line, via the above-described pull-up resistors, that is, the first pull-up resistor R1 and the second pull-up resistor R2.

According to the display device 1c, even when the disconnection occurs in the video wiring line VLn extending across the bending portion FR, the data signal line DLn electrically connected to the video wiring line VLn is not brought into a floating state. Since the data signal line DLn electrically connected to the video wiring line VLn is not brought into the floating state, a current greatly exceeding a normally assumed current can be suppressed from flowing through the wiring line. Thus, in the display device 1c, the possibility of occurrence of a failure at a level that cannot be repaired, such as high-luminance display, heat generation, and smoke generation, can be reduced, and the display device 1c can be achieved in which the possibility of normal driving is improved by repairing the disconnected portion of the video wiring line VLn extending across the bending portion FR.

As illustrated in FIG. 10, the display device 1c includes the first shielding portion SHE1 electrically connected to the first high-potential-side power supply voltage trunk wiring line ELVDDM, which is the first high-potential-side power supply voltage wiring line, and the second shielding portion SHE2 electrically connected to the second high-potential-side power supply voltage wiring line GVDD. Similarly to the case illustrated in FIG. 4, the first shielding portion SHE1 is provided between the first high-potential-side power supply voltage trunk wiring line ELVDDM and the first pull-up resistor R1 and overlaps at least a part of the first pull-up resistor R1, and similarly to the case illustrated in FIG. 4, the second shielding portion CHE2 is also provided between the second high-potential-side power supply voltage wiring line GVDD and the second pull-up resistor R2 and overlaps at least a part of the second pull-up resistor R2.

The first high-potential-side power supply voltage trunk wiring line ELVDDM and the first pull-up resistor R1 illustrated in FIG. 10 may be electrically connected to each other via the first shielding portion SHE1 as in the case illustrated in FIG. 4, and the second high-potential-side power supply voltage wiring line GVDD and the second pull-up resistor R2 illustrated in FIG. 10 may be electrically connected to each other via the second shielding portion SHE2 as in the case illustrated in FIG. 4.

The display device 1c includes the first shielding portion SHE1 electrically connected to the first high-potential-side power supply voltage trunk wiring line ELVDDM, which is the first high-potential-side power supply voltage wiring line, and maintained at the first high-potential-side power supply voltage, and the second shielding portion SHE2 electrically connected to the second high-potential-side power supply voltage wiring line GVDD and maintained at the second high-potential-side power supply voltage. Thus, an influence of the electrical field of other wiring lines and an influence of the electrostatic capacitance of various insulating films can be reduced by the first shielding portion SHE1 and the second shielding portion SHE2, and a configuration can be obtained in which only the influence of the stable high potential from the first shielding portion SHE1 and the second shielding portion SHE2 is received.

Fifth Embodiment

Next, a fifth embodiment of the disclosure will be described with reference to FIG. 11. The present embodiment is different from the display device 1 according to the first embodiment described above that includes the pixel circuit GC(m,n) including only the transistors T1 to T7, which are the P-type transistors, in that a pixel circuit GC'(m,n) included in a display device according to the present embodiment includes the transistors T3 to T6, which are the P-type transistors, and the transistors T1, T2, and T7, which are the N-type transistors. The other details are as described in the first embodiment. For convenience of description, members having the same functions as those shown in the drawings according to the first embodiment are denoted by the same reference numerals and signs, and descriptions thereof will be omitted.

Figure 11:
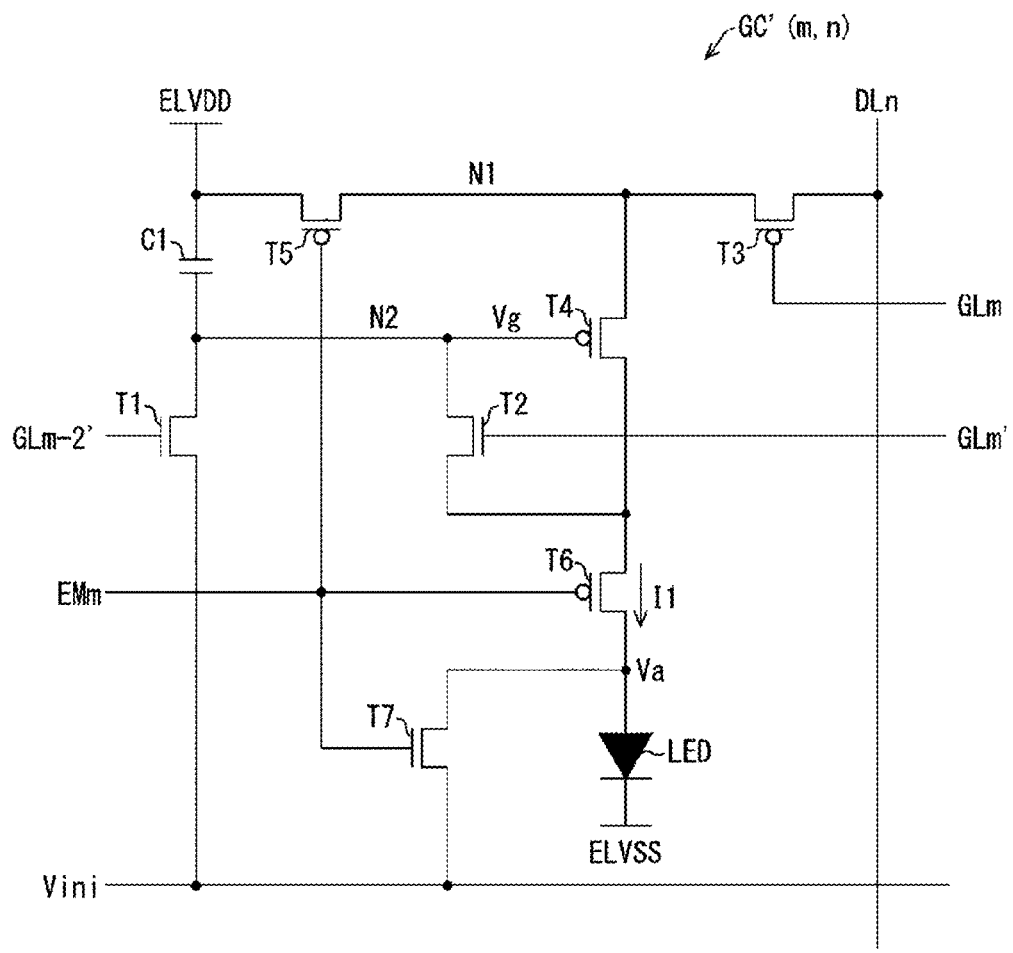
FIG. 11 is a circuit diagram illustrating a pixel circuit provided in a display device according to a fifth embodiment.

FIG. 11 is a circuit diagram illustrating the pixel circuit GC'(m,n) provided in the display device according to the fifth embodiment.

As illustrated in FIG. 11, in the present embodiment, the transistors T1, T2, T7 are the N-type transistors, and the transistors T3 to T6 are the P-type transistors, which are included in the pixel circuit GC'(m,n). A case will be described as an example in which each of the transistors T3 to T6, which are the P-type transistors, includes the polycrystalline silicon layer as the semiconductor layer (first semiconductor layer) and each of the transistors T1, T2, T7, which are the N-type transistors, includes the oxide semiconductor layer as the semiconductor layer (second semiconductor layer). However, no such limitation is intended.

In the display device according to the fifth embodiment including the above-described pixel circuit GC'(m,n), a semiconductor layer forming the pull-up resistor can be made of the same material as the above-described polycrystalline silicon layer or the above-described oxide semiconductor layer.

In the pixel circuit GC'(m,n) illustrated in FIG. 11, an (m-2)-th N-type transistor driving scanning signal is supplied to the gate electrode of the transistor T1, which is the N-type transistor, via an N-type transistor driving scanning signal line GLm-2', and an m-th N-type transistor driving scanning signal is supplied to the gate electrode of the transistor T2, which is the N-type transistor, via an N-type transistor driving scanning signal line GLm'.

The pixel circuit GC'(m,n) illustrated in FIG. 11 is different from the pixel circuit GC(m,n) illustrated in FIG. 3 in that one initialization voltage is supplied via the initialization voltage wiring line Vini.

In FIG. 11, N1 is a first node, N2 is a second node, Vg is a voltage of the gate electrode of the transistor T4, Va is a voltage of the anode electrode of the light-emitting element LED, and I1 is a current flowing through the transistor T6.

Appendix

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a display device.

REFERENCE SIGNS LIST 1, 1a, 1b, 1c Display device
3a Semiconductor layer (first semiconductor layer)

3b Semiconductor layer
ELVDDM First high-potential-side power supply voltage trunk wiring line (high-potential-side power supply voltage wiring line)
ELVDDEn First high-potential-side power supply voltage branch wiring line (high-potential-side power supply voltage wiring line)
GVDD Second high-potential-side power supply voltage wiring line (high-potential-side power supply voltage wiring line)
SHE Shielding portion
SHE1 First shielding portion
SHE2 Second shielding portion
R1 Pull-up resistor (first pull-up resistor)
R2 Pull-up resistor (second pull-up resistor)
DLn Data signal line
GLm Scanning signal line
VLn Video wiring line
FR Bending portion
TR Terminal portion
DA Display region
NDA Frame region
D1 Extending direction of data signal line
D2 Extending direction of scanning signal line
GC, GC' Pixel circuit
T1 to T7 Transistor
LED Light-emitting element

The invention claimed is:

1. A display device comprising:
a display region including a data signal line, and a frame region surrounding the display region; and
a high-potential-side power supply voltage wiring line provided at least in the frame region,
wherein the frame region includes
a bending portion provided intersecting with an extending direction of the data signal line, and
a video wiring line electrically connected to the data signal line and extending across the bending portion, and
the data signal line is electrically connected to the high-potential-side power supply voltage wiring line via a pull-up resistor.

2. The display device according to claim 1, further comprising
a shielding portion electrically connected to the high-potential-side power supply voltage wiring line,
wherein the shielding portion is provided between the high-potential-side power supply voltage wiring line and the pull-up resistor and overlaps at least a part of the pull-up resistor.

3. The display device according to claim 2,
wherein the high-potential-side power supply voltage wiring line and the pull-up resistor are electrically connected to each other via the shielding portion.

4. The display device according to claim 1,
wherein the high-potential-side power supply voltage wiring line is a first high-potential-side power supply voltage wiring line provided in the display region and the frame region,
the pull-up resistor is electrically connected to an end portion of the data signal line farther from the bending portion, and
the data signal line is electrically connected to the first high-potential-side power supply voltage wiring line provided in the frame region via the pull-up resistor.

5. The display device according to claim 1,
wherein the high-potential-side power supply voltage wiring line is a second high-potential-side power supply voltage wiring line provided in the frame region,
the pull-up resistor is electrically connected to an end portion of the data signal line farther from the bending portion, and
the data signal line is electrically connected to the second high-potential-side power supply voltage wiring line via the pull-up resistor.

6. The display device according to claim 1,
wherein the high-potential-side power supply voltage wiring line includes
a first high-potential-side power supply voltage wiring line provided in the display region and the frame region, and
a second high-potential-side power supply voltage wiring line provided in the frame region,
the pull-up resistor includes
a first pull-up resistor electrically connected to an end portion of the data signal line farther from the bending portion, and
a second pull-up resistor connected in series to the first pull-up resistor, and
the data signal line is electrically connected to the first high-potential-side power supply voltage wiring line provided in the frame region or the second high-potential-side power supply voltage wiring line provided in the frame region via the first pull-up resistor and the second pull-up resistor.

7. The display device according to claim 6, further comprising
a first shielding portion electrically connected to one of the first high-potential-side power supply voltage wiring line and the second high-potential-side power supply voltage wiring line,
a second shielding portion electrically connected to the other of the first high-potential-side power supply voltage wiring line and the second high-potential-side power supply voltage wiring line,
wherein the first shielding portion is provided between the one of the first high-potential-side power supply voltage wiring line and the second high-potential-side power supply voltage wiring line and the first pull-up resistor and overlaps at least a part of the first pull-up resistor, and
the second shielding portion is provided between the other of the first high-potential-side power supply voltage wiring line and the second high-potential-side power supply voltage wiring line and the second pull-up resistor and overlaps at least a part of the second pull-up resistor.

8. The display device according to claim 7,
wherein the one of the first high-potential-side power supply voltage wiring line and the second high-potential-side power supply voltage wiring line and the first pull-up resistor are electrically connected to each other via the first shielding portion, and
the other of the first high-potential-side power supply voltage wiring line and the second high-potential-side power supply voltage wiring line and the second pull-up resistor are electrically connected to each other via the second shielding portion.

9. The display device according to claim 1,
wherein the pull-up resistor is made of a semiconductor layer.

10. The display device according to claim 9,
wherein the display region includes a pixel circuit including
a first transistor including a first input electrode and a first semiconductor layer, and
a second transistor including a second input electrode and a second semiconductor layer,
the data signal line is electrically connected to one of the first input electrode and the second input electrode, and
the semiconductor layer is made of the same material as the first semiconductor layer or the second semiconductor layer.

11. The display device according to claim 10,
wherein the first semiconductor layer is a polycrystalline silicon layer,
the second semiconductor layer is an oxide semiconductor layer, and
the semiconductor layer is made of the same material as the polycrystalline silicon layer.

12. The display device according to claim 10,
wherein the first semiconductor layer is a polycrystalline silicon layer,
the second semiconductor layer is an oxide semiconductor layer, and
the semiconductor layer is made of the same material as the oxide semiconductor layer.

13. The display device according to claim 9,
wherein the semiconductor layer is a semiconductor layer not doped with an impurity.

14. The display device according to claim 1,
wherein a resistance value of the pull-up resistor is 30 MΩ or more and 87 MΩ or less.

15. The display device according to claim 14,
wherein the resistance value of the pull-up resistor is 50 MΩ or more and 80 MΩ or less.

* * * * *